US005270258A

United States Patent [19]

Yoshida

[11] Patent Number: 5,270,258

[45] Date of Patent: Dec. 14, 1993

[54] MICROMINIATURE VACUUM TUBE MANUFACTURING METHOD

[75] Inventor: Masahiro Yoshida, Itami, Japan

[73] Assignee: Mitsubishi Denki Kabushiki Kaisha, Tokyo, Japan

[21] Appl. No.: 720,611

[22] Filed: Jun. 25, 1991

[30] Foreign Application Priority Data

Jun. 27, 1990 [JP] Japan .................................. 2-170462

[51] Int. Cl.$^5$ .......................................... H01L 21/465

[52] U.S. Cl. .................................. 437/228; 156/647; 445/50; 445/51

[58] Field of Search ......................... 437/93, 228, 203; 445/41-52; 313/309, 313, 351, 336; 156/647

[56] References Cited

U.S. PATENT DOCUMENTS

| | | | |
|---|---|---|---|
| 4,149,175 | 4/1979 | Inoue et al. | 437/129 |
| 4,983,878 | 1/1991 | Lee et al. | 313/336 |
| 5,012,153 | 4/1991 | Atkinson et al. | 313/309 |
| 5,090,932 | 2/1992 | Dieumegard et al. | 437/93 |
| 5,126,287 | 6/1992 | Jones | 445/50 |

FOREIGN PATENT DOCUMENTS

| | | | |
|---|---|---|---|
| 0272178 | 6/1988 | European Pat. Off. . | |
| 0278405 | 8/1988 | European Pat. Off. . | |
| 0306173 | 3/1989 | European Pat. Off. . | |
| 56-160740 | 12/1981 | Japan | 437/228 |
| 8806345 | 8/1988 | PCT Int'l Appl. . | |
| 2209432 | 5/1989 | United Kingdom . | |
| 2240426 | 7/1991 | United Kingdom . | |

OTHER PUBLICATIONS

Spindt et al., "Physical Properties of Thin-Film Field Emission Cathodes With Molybdenum Cones", Journal of Applied Physics, vol. 47, No. 12, Dec. 1976, pp. 5248-5263.

*Primary Examiner*—Olik Chaudhuri
*Assistant Examiner*—Ken Horton
*Attorney, Agent, or Firm*—Leydig, Voit & Mayer

[57] ABSTRACT

A method of manufacturing a microminiature vacuum tube includes forming a mask layer on a first surface of a monocrystalline substrate and removing the mask layer where a cathode is to be formed, anisotropically etching the monocrystalline substrate at the surface using the mask layer to form a recess in the substrate having a V-shaped cross-section, covering the V-shaped recess with an electron-emitting cathode material, successively forming a first insulator film, a gate material, a second insulator film, and an anode material on the second surface of the substrate, removing portions of the anode material, second insulator film, gate material, and first insulator film from a portion of the second surface opposite the V-shaped recess, and etching the monocrystalline substrate using the first insulator film as a mask until the tip of the cathode material is exposed. Uniformly shaped cathodes can be formed with good controllability and reproducibility according to the invention.

5 Claims, 5 Drawing Sheets

MICROMINIATURE VACUUM TUBE MANUFACTURING METHODFIELD OF THE INVENTION

The present invention relates to a microminiature vacuum tube having a cathode which emits electrons by means of electric field emission, a gate which controls the electrons and an anode which receives the electrons, and housed in a vacuum container. The present invention also relates to a manufacturing method thereof.

BACKGROUND OF THE INVENTION

The microminiature vacuum tube utilizes electrons traveling in vacuum, and unlike the general vacuum tubes, it is formed on a semiconductor substrate. Therefore, a cathode of electric field emission type is used which emits electrons by means of an electric field. To emit electrons, the shape of the electron emitting end of the cathode is required to be as sharp as possible.

A description is given of an example of the conventional method of manufacturing a microminiature vacuum tube with reference to FIGS. 3(*a*)-3(*e*).

First, as shown in FIG. 3(*a*), a mask material is formed on the entire surface of a monocrystalline substrate 1, and the mask material on portions other than a portion 2 to become a cathode is removed by photolithography.

Next, as shown in FIG. 3(*b*), the substrate 1 is etched by dry etching such as RIE (reactive ion etching) using the mask material 2 as a mask. Furthermore, the substrate 1 is etched in the lateral direction and obliquely by anisotropic wet etching using an etchant such as potassium hydroxide, and a protrusion is formed which has an acute-angled tip 9 which becomes a cathode later (FIG. 3(*c*)).

Next, an insulating material 5 for protecting the tip shape of the cathode is formed on the entire surface of the substrate and a metal film 68 is formed thereon, and thereafter resist patterns 11 are produced thereon by photolithography (FIG. 3(*d*)). The metal film 68 and the insulating material 5 are etched by RIE or the like using resist patterns 11 as a mask and a gate 6 and an anode 8 are at periphery of the cathode formed on the substrate 1, thereby completing a device (FIG. 3(*e*)).

When this device is used, the cathode voltage Vc is made the ground level by grounding the substrate 1 as shown in FIG. 4, and a voltage $V_A$ of 100 to 500 V is applied to the anode 8. Electrons emitted from the cathode 9 into vacuum by means of electric field emission are collected by the anode 8. Meanwhile, the quantity of electrons flowing from the cathode 9 to the anode 8 is controlled by applying a voltage of several tens of volts to the gate 6 as a gate voltage $V_G$.

In the conventional microminiature vacuum tube manufactured by the method as described above, etching in the lateral direction is utilized to form the cathode, therefore the control of timing for ending etching when the tip shape of the cathode becomes acute-angled is very difficult. Particularly, in fabricating a plurality of cathodes on the substrate, this control is further difficult. Actually, as shown in FIG. 5, a cathode **12*b* which has not been etched fully, a cathode 12*c* which has been etched excessively and the like are formed besides a cathode 12*a*** having a desired shape. Thus, variations occur in the shape of the cathode.

Also, the area of adhesion between the portion to become the cathode on the surface of the substrate 1 and the mask material 2 becomes smaller as the etching progresses, and therefore the adhesion force between the both is weakened. This results in peeling of the mask material and the etched shape varies. Therefore it is difficult to obtain a uniform etched shape.

Further, the tip of the cathode is required to be protected when the gate and the anode are formed, and in the conventional example, the tip is protected by an insulator film such as $SiO_2$. However, the tip part of the cathode is actually exposed to an etching gas immediately before the gate 6 and the anode 8 are formed, and for this reason, the tip part of the cathode is damaged and it is difficult to maintain the original sharp tip shape.

As described above, in the conventional manufacturing method, the controllability and the reproducibility of the etching process for forming the cathode are worse, and further the tip part of the cathode is damaged in the stage of forming the gate and the anode, incurring non-uniformity in the device characteristics.

SUMMARY OF THE INVENTION

The present invention is directed to solving the above-described problems and has its object to provide a microminiature vacuum tube which can produce a cathode shape with good uniformity and which can be easily integrated. Another object of the present invention is to provide a manufacturing method of a microminiature vacuum tube.

A manufacturing method of a microminiature vacuum tube in accordance with the present invention comprises the following steps:

(a) forming a mask layer on a monocrystalline substrate, and removing a portion of the mask layer, where a cathode is to be formed, by photolithography, (b) etching the monocrystalline substrate with the mask layer used as a mask using an anisotropic etchant, producing a recess having a V-shaped cross-section and forming a material to become the cathode in the recess, (c) forming a first insulating material on the surface opposite the recess of the monocrystalline substrate, forming a material to become a gate, forming a second insulating material on the top surface thereof, and further forming a material to become an anode on the top surface thereof, (d) removing the anode material, the insulator film and the gate material on the portion facing the cathode tip by photolithography, (e) etching the monocrystalline substrate with the gate material used as a mask until the tip of the cathode material appears.

In the microminiature vacuum tube in accordance with the present invention, the tip part of the cathode material manufactured by the above-mentioned processes (a) through (e) becomes the cathode, and the gate material and the anode material remaining in the above-mentioned process (d) become the gate and the anode.

In the method of manufacturing the microminiature vacuum tube of the present invention, since only anisotropic etching of monocrystalline is used as a means for forming the shape of the cathode, the shape of the tip is obtained stably.

Since the tip portion of the cathode is protected by the material of the substrate until the gate and the anode are completed formed, changes in the shape of the cathode tip do not occur in manufacturing.

In the microminiature vacuum tube of the present invention, the gate and the anode are located along a direction perpendicular to the cathode, and therefore the interval between the cathode and the anode can be made as small as possible in manufacturing, and integration thereof with other devices is simplified.

DETAILED DESCRIPTION OF THE PREFERRED EMBODIMENTS

Figure 1A:
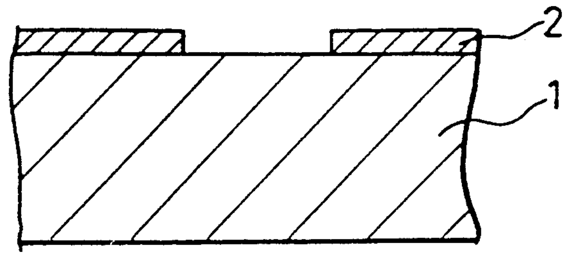
FIGS. 1(*a*)-1(*f*) are views showing a method of manufacturing a microminiature vacuum tube in accordance with an embodiment of the present invention.
Figure 1B:
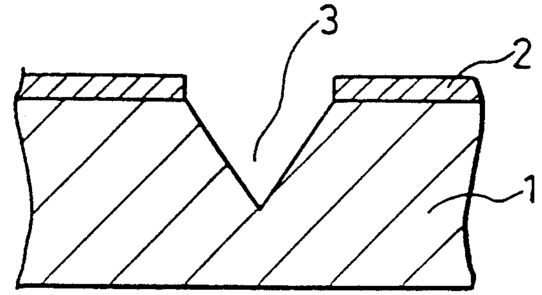
Figure 1C:
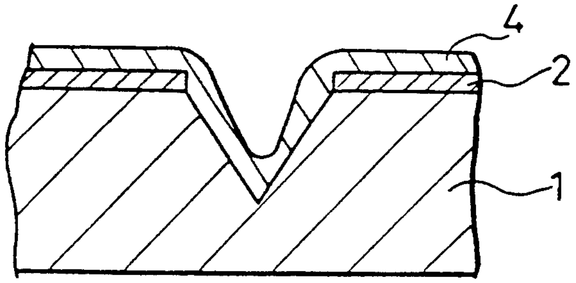
Figure 1D:
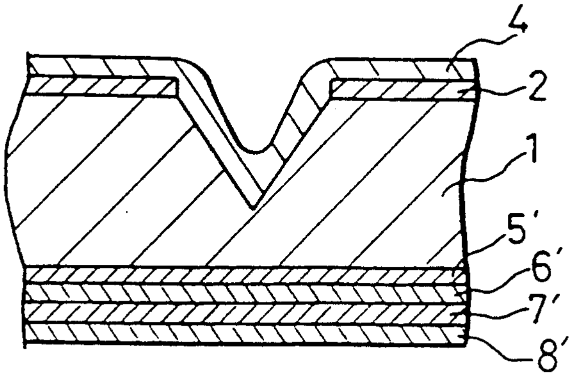
Figure 1E:
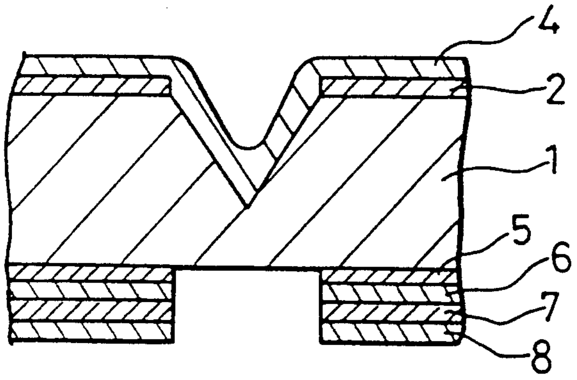
Figure 1F:
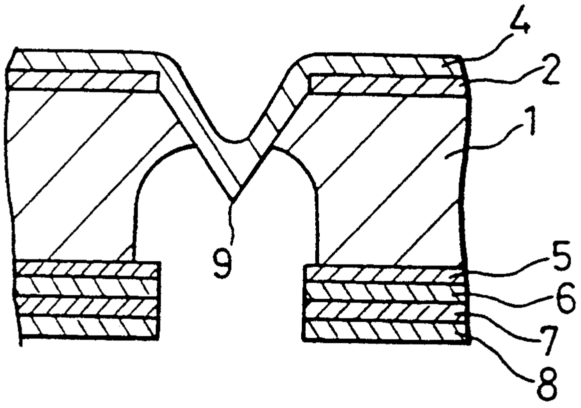

Hereinafter, description is made on an embodiment of the present invention in reference to drawings.

FIGS. 1(*a*)-1(*f*) are views showing respective major processes in a method of manufacturing a microminiature vacuum tube in accordance with an embodiment of the present invention, and FIGS. 1(*a*)-1(*e*) show cross-sectional structures of processed devices in five stages of manufacturing process, and FIG. 1(*f*) shows the cross-sectional structure of a completed device.

In FIGS. 1(*a*)-1(*f*), reference numeral 1 designates a monocrystalline semiconductor substrate. A mask material 2 is disposed on the semiconductor substrate 1. A V-shaped concave part 3 is formed on a first main surface of the substrate 1. An electric field emitting material 4 is used to become a cathode material. Reference numerals 5, 5', 7 and 7' designate insulating materials. Reference numeral 6' designates a gate material and reference numeral 8' designates an anode material. Reference numeral 6 designates a gate and reference numeral 8 designates an anode. The cathode is formed to have a sharp tip 9.

Next, description is made on a manufacturing method.

First, a monocrystalline silicon substrate having a (100) facet is used for the monocrystalline substrate 1, and on a first main surface thereof, a mask material such as $SiO_2$, $Si_3N_4$ or SiNO is formed in a thickness of several hundreds of angstroms or more by the plasma CVD method. A resist-pattern (not illustrated) is provided on this mask using photolithography techniques, and a substrate surface region whereon the cathode is to be installed is exposed by RIE using the resist pattern as a mask (FIG. 1(*a*)).

Next, the substrate 1 is etched with an anisotropic etching solution such as potassium hydroxide and isopropyl alcohol with using the mask layer 2 as a mask.

At this time, because the etching speed of a (111) facet of Si as about 30 times as fast as that of a (100) facet, when etching is performed with window in the mask layer 2 on the substrate having such a (100) facet, the V-shaped recess 3 consisting of (111) facets making an angle of 54° with the (100) facet is formed (FIG. 1(*b*)). This method of etching using the mask layer 2 as a mask produces high adhesiveness between the mask layer and the substrate in comparison with the method using a resist as a mask and the shape after etching is easily stabilized. Therefore, this method is quite advantageous.

Next, the electric field emitting material 4 comprising a material easily emits electrons and has a small work function such as molybdenum is formed, for example, in a thickness of 1,000 Å or more by sputtering to cover the V-shaped recess 3 (FIG. 1(*c*)).

Next, a $Si_3N_4$ film as the insulating material 5' is formed on a second main surface opposite to the face of the V-shaped recess 3 of the substrate 1. The gate material 6' is formed on this $Si_3N_4$ film 5', the insulating material 7' is formed on this gate material 6', and the anode material 8' is further formed on this insulating material 7'. Here, the film thickness of each layer is set to 1,000 Å or more, and a metal such as Au, Ti, Ni or Al is used as the gate material 6' and the anode material 8' (FIG. 1(*d*)).

Next, by means of photolithography technique, a window is opened by etching the anode material 8', the insulating material 7', the gate material 6' and the insulating material 5' at a region confronting the V-shaped concave part 3 by ion milling or RIE using $SF_6$ or $CF_4$ gas to expose the surface of the substrate 1 (FIG. 1(*e*)). The gate material 6' and the anode material 8' remaining at this time are used later as the gate electrode 6 and the anode electrode 8.

Next, the substrate 1 is etched using the insulating material 5 as a mask, and the tip 9 of the electric field emitting material 4 is exposed. For this etching, wet etching using potassium hydroxide and isopropyl alcohol is used. Since the speed of the etching of semiconductor is generally tens of thousands of times as fast as that of metal, the electric field emitting material such as molybdenum is not over-etched in this etching process, and the sharp tip 9 of the electric field emitting material is exposed at the etching opening with good controllability and good reproducibility. Also, the shape of the tip 9 is determined by crystalline property of the material of the monocrystalline semiconductor used for the substrate 1, and therefore uniform shapes are always obtained (FIG. 1(*f*)). Also, the insulating material 5 serves as both an insulator for isolating the gate electrode 6 from the substrate 1 and a mask in etching the substrate 1. The sharp tip 9 works as the cathode for emitting electrons.

Figure 2:
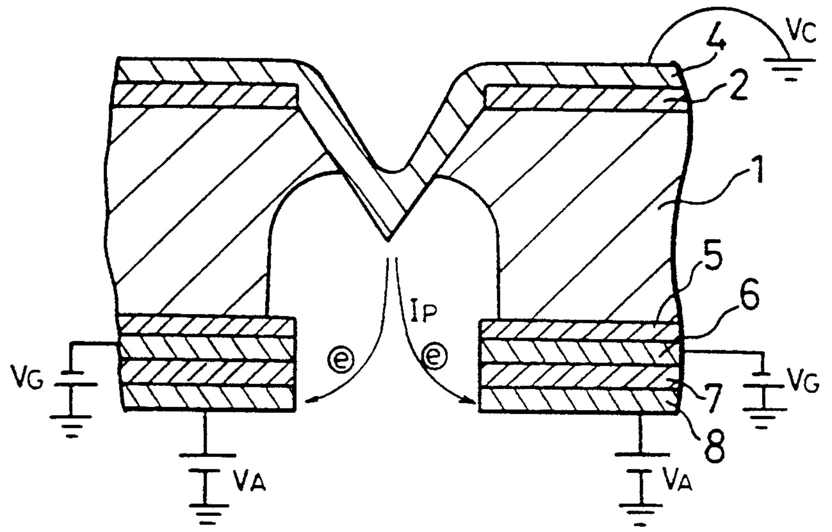
FIG. 2 is a view for explaining operation of a microminiature vacuum tube formed by a manufacturing method in accordance, with an embodiment of the present invention.
Figure 3A:
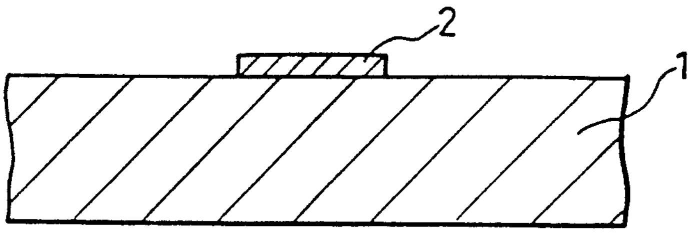
FIG. 3(a) (PRIOR ART)
FIGS. 3(*a*)-3(*e*) are views showing a conventional method of manufacturing a microminiature vacuum tube.
Figure 3B:
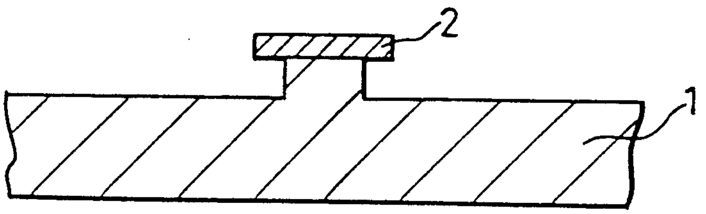
FIG. 3(b) (PRIOR ART)
Figure 3C:
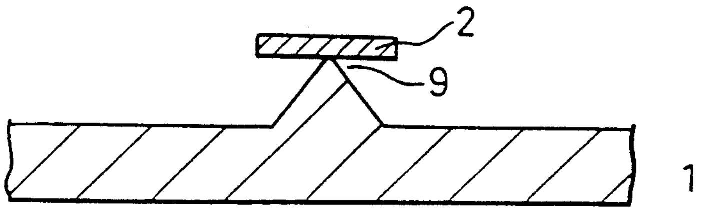
FIG. 3(c) (PRIOR ART)
Figure 3D:
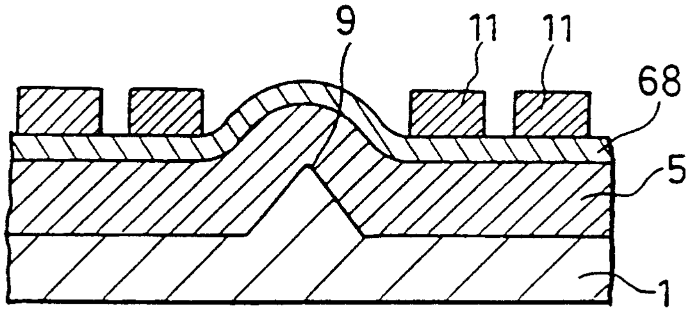
FIG. 3(d) (PRIOR ART)
Figure 3E:
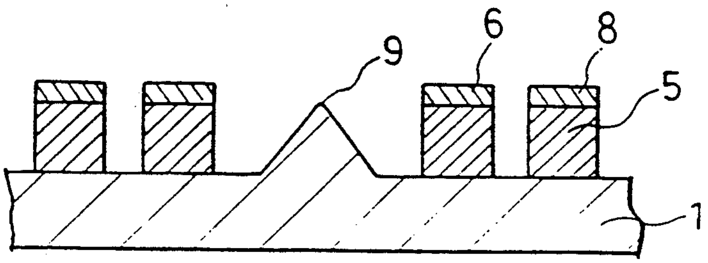
FIG. 3(e) (PRIOR ART)
Figure 4:
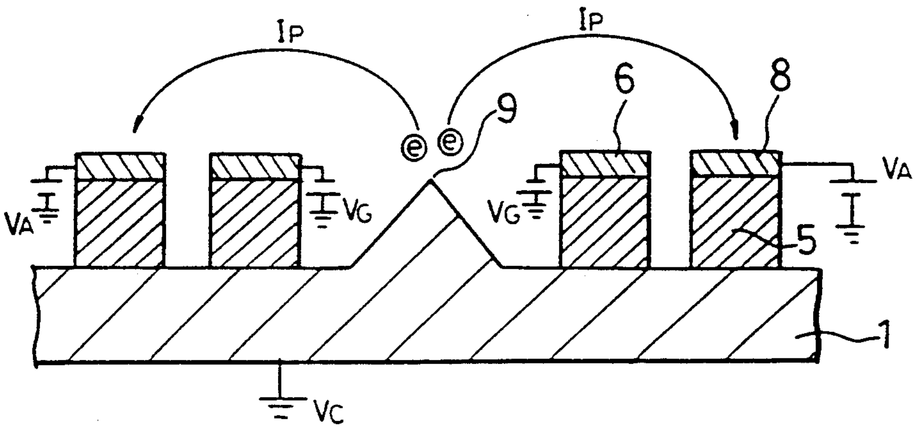
F I G. 4 (PRIOR ART)
FIG. 4 is a view for explaining operation of a microminiature vacuum tube formed by the conventional manufacturing method.
Figure 5:
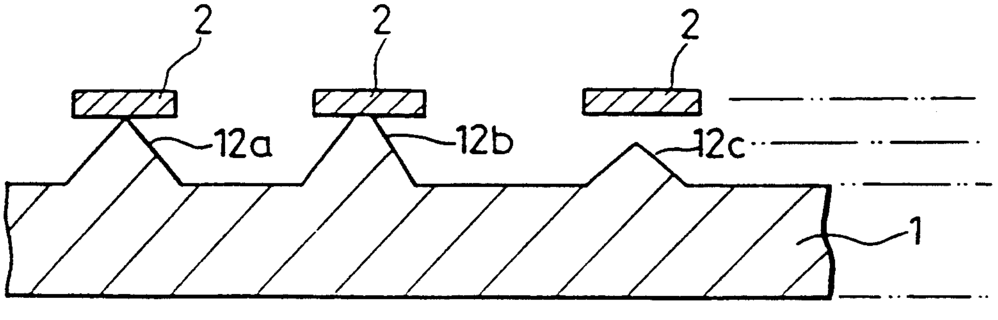
F I G. 5 (PRIOR ART)
FIG. 5 is a view for explaining a problem in the conventional method of manufacturing a microminiature vacuum tube.

As shown in FIG. 2, electrons emitted from the tip 9 of the cathode in the vertical direction by electric field emission are controlled by a voltage applied to the gate 6 and flow into the anode 8.

In the conventional microminiature vacuum tube, the gate and the anode are formed along a direction parallel to the cathode, and therefore the interval between the cathode and the anode is kept at about 50 microns at a minimum. However, in the microminiature vacuum tube obtained by the manufacturing method of this embodiment, the gate 6 and the anode 8 are formed along a direction perpendicular to the cathode 9, and therefore the interval between the cathode 9 and the anode 8 can be set easily by the thickness of the substrate 1, the thickness of the insulating films 5 and 7, the gate 6 and the anode 8 and the like, and this interval can be set at 10 microns or less, and further can be set to a minute value less than several microns.

Therefore, in the microminiature vacuum tube of this embodiment, the anode voltage $V_A$ has only to be about 100 V and the gate voltage $V_G$ has only to be about 10 V, and a small power source can be used. Thus, this embodiment has a big advantage in miniaturizing the device and reducing the size of the whole system.

In the above-illustrated embodiment, a description is given of a device having one cathode, but a plurality of cathodes can be fabricated on the same substrate. When the individual electrodes are not separated, they are in a parallel connection, and thereby the current capacity can be larger.

In a portion of the substrate where the cathode is not formed, the material of the substrate is not etched, and therefore other devices such as transistors, diodes, resistors and the like can be integrated thereon.

While in the above-mentioned embodiment a Si monocrystalline substrate is used for the monocrystalline substrate 1, this can be another substrate, provided that it is a material showing anisotropy in etching. For example, a compound semiconductor substrate such as GaAs substrate or the like can be used.

In a case where GaAs is used as the substrate 1, when a (100) facet substrate is used and [011] direction is taken as a direction in which the dependency of the etching on crystal orientation appears, a V-shaped groove making an angle of about 45° with the (100) facet is formed. For the etching, for example, a solution of sulfuric acid, hydrogen peroxide and water is preferably used.

As described above, in the microminiature vacuum tube obtained by the manufacturing method of this embodiment, the shape of cathode is uniform, and the interval between the cathode and anode is small, on the order of microns, and when integrated, high performance and high reliability are obtained without variations in the device characteristics. Thus, this vacuum tube can be effectively used for high-frequency devices used in the millimeter wave band.

As described above, in accordance with the present invention, a monocrystalline substrate is etched to form a recess having a V-shaped cross-section, the V-shaped recess is covered with a cathode material, a first insulator film, a gate material, a second insulator film and an anode material are sequentially formed on a second main surface of the monocrystalline substrate, and portions thereof confronting the V-shaped recess of the substrate are etched until the tip of the above-mentioned cathode material appears, and the exposed sharp tip is used as the cathode. Therefore the cathode having a uniform shape which is determined by the crystalline property of the substrate is obtained, and further the sharp tip of the cathode is not exposed on the surface in forming the gate and the anode, and therefore changes in the shape of the cathode tip are prevented. Uniformly shaped cathodes are formed with good controllability and good reproducibility.

Furthermore, since the interval between the cathode and the anode can be made small, a high electron emitting efficiency is obtained and the device can be reduced in size.

What is claimed is:

1. A method of manufacturing a microminiature vacuum tube comprising the sequential steps of:

forming a mask layer on a first surface of a monocrystalline substrate and removing the mask layer where a cathode is to be formed;

anisotropically etching said monocrystalline substrate at the first surface using said mask layer as a mask, thereby forming a recess in said substrate having a V-shaped cross-section;

covering said V-shaped recess with an electron-emitting cathode material;

forming a first insulator film on a second surface of said monocrystalline substrate opposite the first surface, forming a gate material on said first insulator film, forming a second insulator film on said gate material, and forming an anode material on said second insulator film;

removing portions of said anode material, second insulator film, gate material, and first insulator film to expose the second surface of said substrate opposite the V-shaped recess in said monocrystalline substrate; and etching said monocrystalline substrate at the second surface using said anode, second insulator, gate, and first insulator films as a mask to expose said cathode material.

2. A method of manufacturing a microminiature vacuum tube in accordance with claim 1, wherein said monocrystalline substrate has a dependency on crystal orientation in etching.

3. A method of manufacturing a microminiature vacuum tube in accordance with claim 1, wherein said monocrystalline substrate material is silicon having (100) oriented first and second surfaces including anisotropically etching said silicon substrate with a mixture of potassium hydroxide and isopropyl alcohol to expose said cathode material, said V-shaped recess having (111) oriented surfaces.

4. A method of manufacturing a microminiature vacuum tube in accordance with claim 1, wherein said monocrystalline substrate material is GaAs having (100) oriented first and second surfaces including anisotropically etching said substrate with a mixture of sulfuric acid, hydrogen peroxide, and water to expose said cathode material.

5. A method of manufacturing a microminiature vacuum tube in accordance with claim 1, including depositing one of $SiO_2$, $Si_3N_4$, and SiNO as said mask layer.

* * * * *